(12) United States Patent
Katti (10) Patent No.: US 8,399,964 B2
(45) Date of Patent: Mar. 19, 2013

(54) MULTILAYER STRUCTURES FOR MAGNETIC SHIELDING

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 64 days.

(21) Appl. No.: 12/861,442

(22) Filed: Aug. 23, 2010

(65) Prior Publication Data

US 2011/0316129 A1 Dec. 29, 2011

Related U.S. Application Data

(62) Division of application No. 11/445,874, filed on Jun. 2, 2006, now Pat. No. 7,795,708.

(51) Int. Cl.
*H01L 23/552* (2006.01)

(52) U.S. Cl. . 257/659; 257/422; 257/660; 257/E23.114; 257/E29.181; 257/679; 361/818

(58) Field of Classification Search .................. None
See application file for complete search history.

(56) References Cited

U.S. PATENT DOCUMENTS

| | | | | |
|---|---|---|---|---|
| 3,916,248 | A * | 10/1975 | Nicol | 324/248 |
| 4,090,097 | A * | 5/1978 | Seilly | 310/27 |
| 5,045,637 | A | 9/1991 | Sato et al. | |
| 5,639,989 | A * | 6/1997 | Higgins, III | 174/386 |
| 5,714,936 | A * | 2/1998 | Regelsberger | 340/572.6 |
| 6,396,713 | B1 | 5/2002 | Iwanami | |
| 6,566,596 | B1 | 5/2003 | Askew | |
| 6,625,040 | B1 | 9/2003 | Tuttle | |
| 6,869,683 | B2 * | 3/2005 | Sakurai et al. | 428/448 |
| 6,924,168 | B2 | 8/2005 | Tuttle | |
| 2001/0000680 | A1 * | 5/2001 | Matono et al. | 360/234.7 |
| 2002/0000639 | A1 * | 1/2002 | Inoue et al. | 257/531 |
| 2002/0007550 | A1 * | 1/2002 | Shoji | 29/603.07 |
| 2002/0011646 | A1 * | 1/2002 | Liu et al. | 257/531 |
| 2002/0024116 | A1 * | 2/2002 | Tuttle | 257/630 |
| 2002/0078551 | A1 * | 6/2002 | Ohtsuka | 29/603.07 |
| 2002/0125978 | A1 * | 9/2002 | Aoki et al. | 336/5 |
| 2002/0163335 | A1 * | 11/2002 | Prammer et al. | 324/303 |
| 2002/0181141 | A1 * | 12/2002 | Kuroiwa et al. | 360/77.02 |
| 2002/0196591 | A1 * | 12/2002 | Hujanen et al. | 360/326 |
| 2003/0132494 | A1 * | 7/2003 | Tuttle et al. | 257/433 |
| 2004/0000415 | A1 * | 1/2004 | Rizzo et al. | 174/35 R |
| 2004/0001299 | A1 * | 1/2004 | van Haaster et al. | 361/118 |

(Continued)

FOREIGN PATENT DOCUMENTS

EP 0 550 373 A1 7/1993
EP 1 450 378 A2 8/2004

OTHER PUBLICATIONS

Fitzpatrick, Richard. "Propagation in a Conductor" University of Texas. Feb. 2, 2006, http://farside.ph.utexas.edu/teaching/em/lectures/node102.html.*

(Continued)

*Primary Examiner* — Fei Fei Yeung Lopez
(74) *Attorney, Agent, or Firm* — Shumaker & Sieffert, P.A.

(57) ABSTRACT

A magnetic shield is presented. The shield may be used to protect a microelectronic device from stray magnetic fields. The shield includes at least two layers. A first layer includes a magnetic material that may be used to block DC magnetic fields. A second layer includes a conductive material that may be used to block AC magnetic fields. Depending on the type of material that the first and second layers include, a third layer may be inserted in between the first and second layers. The third layer may include a non-conductive material that may be used to ensure that separate eddy current regions form in the first and second layers.

17 Claims, 9 Drawing Sheets

U.S. PATENT DOCUMENTS

| | | | |
|---|---|---|---|
| 2004/0043516 | A1 | 3/2004 | Sharma et al. |
| 2004/0048077 | A1 | 3/2004 | Gabower |
| 2004/0135082 | A1* | 7/2004 | Inanobe et al. ............... 250/306 |
| 2005/0116255 | A1 | 6/2005 | Kato et al. |
| 2005/0207070 | A1* | 9/2005 | Carey et al. ................ 360/324.1 |
| 2005/0219772 | A1* | 10/2005 | Hayashi et al. ............ 360/324.2 |
| 2006/0043539 | A1* | 3/2006 | Thomas et al. ............... 257/659 |
| 2006/0273418 | A1 | 12/2006 | Chung et al. |

OTHER PUBLICATIONS

"Shield for Protecting Magnetic Head from Ambient AC and DC Magnetic Fields" IBM Technical Disclosure Bulletin 18 (1975): 2258-2259.*

"MuShield Design Guide", (Apr. 2006) pp. 10-11.

"Shielding AC Magnetic Fields," Filed Management Services, (Apr. 2006) (http://www.fms-corp.com/mitigation_shielding.php4).

International Search Report for PCT/US2007/063010 dated Dec. 19, 2008.

Examination Report from European application No. 07840129.6, dated May 18, 2009, 3 pp.

Response to Examination Report dated May 18, 2009, from European application No. 07840129.6, filed Aug. 14, 2009, 10 pp.

Examination Report from European application No. 07840129.6, dated Aug. 16, 2011, 5 pp.

International Preliminary Report on Patentability with Written Opinion of international application No. PCT/US2007/063010, dated Jan. 20, 2009, 8 pp.

* cited by examiner

MULTILAYER STRUCTURES FOR MAGNETIC SHIELDING

This application is a divisional of co-pending U.S. patent application Ser. No. 11/445,874, filed Jun. 2, 2006, the entire contents of which are incorporated herein by reference.

GOVERNMENT RIGHTS

The United States Government has acquired certain rights in this invention pursuant to Contract No. DTRA01-00-C-0002 awarded by the Defense Threat Reduction Agency (DTRA).

FIELD

The invention relates to magnetic shielding and more particularly to shielding that protects microelectronic devices from magnetic field effects.

BACKGROUND

A variety of harsh or extreme environments may disrupt a microelectronic device from operating normally. High electric and magnetic fields or ionizing radiation, for example, may create such an environment. Typically, a microelectronic device may be designed or equipped in order to properly work in a particular environment. Such designs may include incorporating protective measures within the device's substrate, such as electrical isolation. Additional or alternative designs use a protective shield that blocks potentially harmful electronic or magnetic fields.

One type of shield, in particular, that is used to protect microelectronic devices from stray external magnetic fields is a magnetic shield. In general, a device will use two shields for protection: one positioned below the device and another positioned above the device. These shields generally comprise high permeability materials that both absorb magnetic forces and redirect the forces away from the semiconductor device. Current magnetic shields, however, are not effective at blocking both direct current (DC) and alternating current (AC) magnetic fields.

SUMMARY

A magnetic shield is presented. The magnetic shield may protect a microelectronic device from AC and DC magnetic fields. The microelectronic device may be located in between a top magnetic shield and a bottom magnetic shield. The top and bottom shields each include a first layer for attenuating DC magnetic fields and a second layer for attenuating AC magnetic fields. The top and bottom shields may be placed in a variety of positions around a device. Moreover, more or fewer shields may be used. Such shields may be tailored to provide desired magnetic field attenuation.

In one example, the first layer includes a magnetic conductive material and the second layer includes a non-magnetic conductive material. A third layer that includes a non-conductive material may also be interposed between the first layer and the second layer. The magnetic conductive material may, for example, be NiFe or NiMoFe. The non-magnetic conductive material may be Al, Cu, or AlCu. The non-conductive material may include a variety of non-conductive materials, such as an epoxy, a dielectric layer, or a ferrite.

A shield may include layers that have a variety of thicknesses. For example, the first layer may have a thickness that is greater than about 20 mils and it may be tailored to attenuate AC magnetic fields. Similarly, the second layer may have a thickness that is greater than about 20 mils. In a further example, the second layer may include a strata of conductive and non-conductive layers. In another example, instead of being a non-magnetic conductive material, the second layer may be a magnetic conductive material.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

DETAILED DESCRIPTION OF THE DRAWINGS a) A Magnetic Shield

Figure 1:
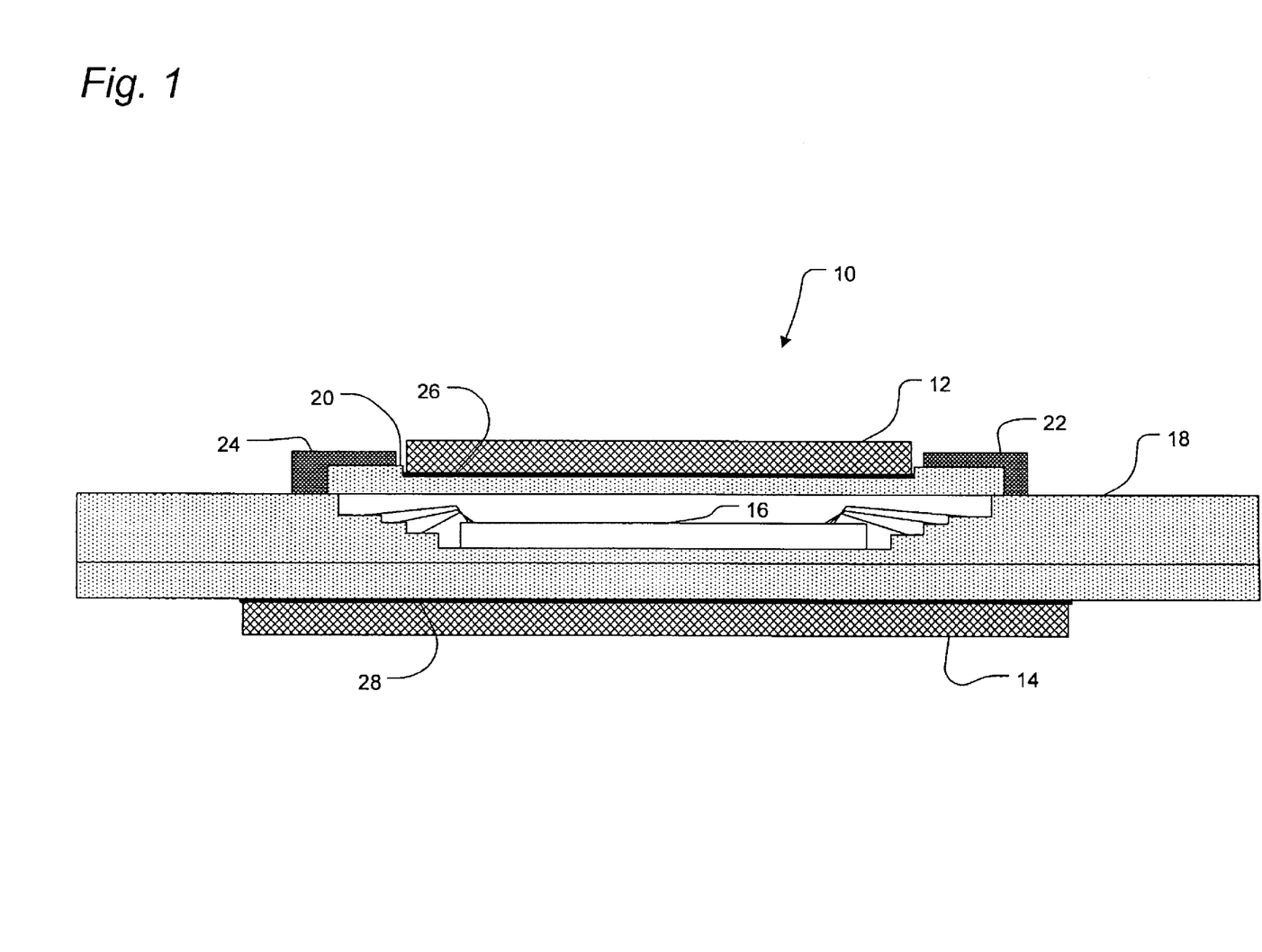
FIG. 1 is a schematic diagram of microelectronic device surrounded by a magnetic shield, according to an example.

FIG. 1 shows a magnetic shield 10 that includes a top shield 12 and a bottom shield 14. The top shield 12 is positioned above a microelectronic device 16 and the bottom shield 14 is positioned below the device 16. The device 16 may be positioned within a package 18 that includes a lid 20. The package 18 and the lid 20 may comprise a variety of materials, such as a ceramic. To mount the lid 20 to the package 18, flanges 22, 24 may be provided. The flanges 22, 24 may comprise Kovar, for example. An epoxy 26, 28 may be used to mount the bottom shield 14 to the package 18 and the top shield 12 to the lid 20. The epoxy may comprise a conductive or a non-conductive material.

Generally speaking, the shield 10 protects the device 16 from stray external magnetic fields. The device 16 may be any type of microelectronic device. For example, the device 16 may be a magnetic memory, such as an MRAM that comprises memory cells that include magnetoresistve memory bits. Alternatively, the device 16 may be a processor or an electronic memory, for example.

The shield 10 may be tailored to protect the device 10 from a variety of magnetic field environments. In particular, such environments may include both direct current (DC) magnetic fields which have little or no frequency (e.g., a relatively static magnetic field having frequency less than about 60 Hz, for example), or alternating current (AC) magnetic fields, which may have a high frequency (e.g., a time-varying magnetic field having frequency greater than 60 Hz). A DC magnetic field may be generated by an electric motor, for example. An AC magnetic field, on the other hand, may be generated by an RF based device, such as a cell phone. Also, AC magnetic fields may be present in high-altitude and space environments. Advantageously, the shield 10 may be tailored to accommodate both DC and AC magnetic field environments.

The shields 12, 14 may be constructed from a variety of materials. Each shield, however, includes at least two layers. The first layer of the shields 12, 14 attenuates DC magnetic fields and the second layer of the shields 12, 14 attenuates AC magnetic fields.

The description below is directed to a variety of arrangements and materials that may be used to construct at least these two attenuating layers. Each of these layers may be magnetic conducting (MC), non-magnetic conducting (NMC), or non-conducting (NC).

An MC layer may be a high magnetic permeability material that comprises a nickel-iron alloy ($Ni_xFe_{1-x}$), or nickel-molybdenum-iron ($Ni_xMo_yFe_{1-x-y}$), for example. Other materials may be added to an MC layer, such as copper (Cu) or Cobalt (Co). An NMC layer, on the other hand, may be aluminum, copper, or an aluminum copper alloy, for example.

An NC layer, on the other hand, may be used to separate conducting layers (i.e., NMC or MC) from each other. NC layers may include a variety of insulative materials, such as an epoxy, a dielectric layer, or a ferrite material. The type of material used for an NC layer may depend on how a shield is fabricated. For example, the epoxy, while acting as an insulator, may also be used to bond an MC layer 104 to an NMC layer 108. If, however, an MC layer 104 or an NMC layer are deposited (e.g., via a sputter deposition process), an NC layer may be grown or deposited in between deposition steps. The NC layer may be silicon dioxide layer, or another type of oxide grown from an MC layer or deposited on top of an MC layer, for example.

In an alternative example, a ferrite material may be used for an NC layer. Ferrite materials comprise magnetic non-conductive (MNC) layers. Such ferrite materials may include MnZn-Ferrites or NiZn-Ferrites.

In general, FIGS. 2-9 show various shields that may be used for the top shield 12 and the bottom shield 14. It should be understood, however, that the described shields may be positioned at a variety of locations adjacent to the device 16 and are not limited to only being located above or below the device 16. Moreover, in certain examples, it may be practical to use more or fewer shields when shielding a device.

b) Example 1

Figure 2:
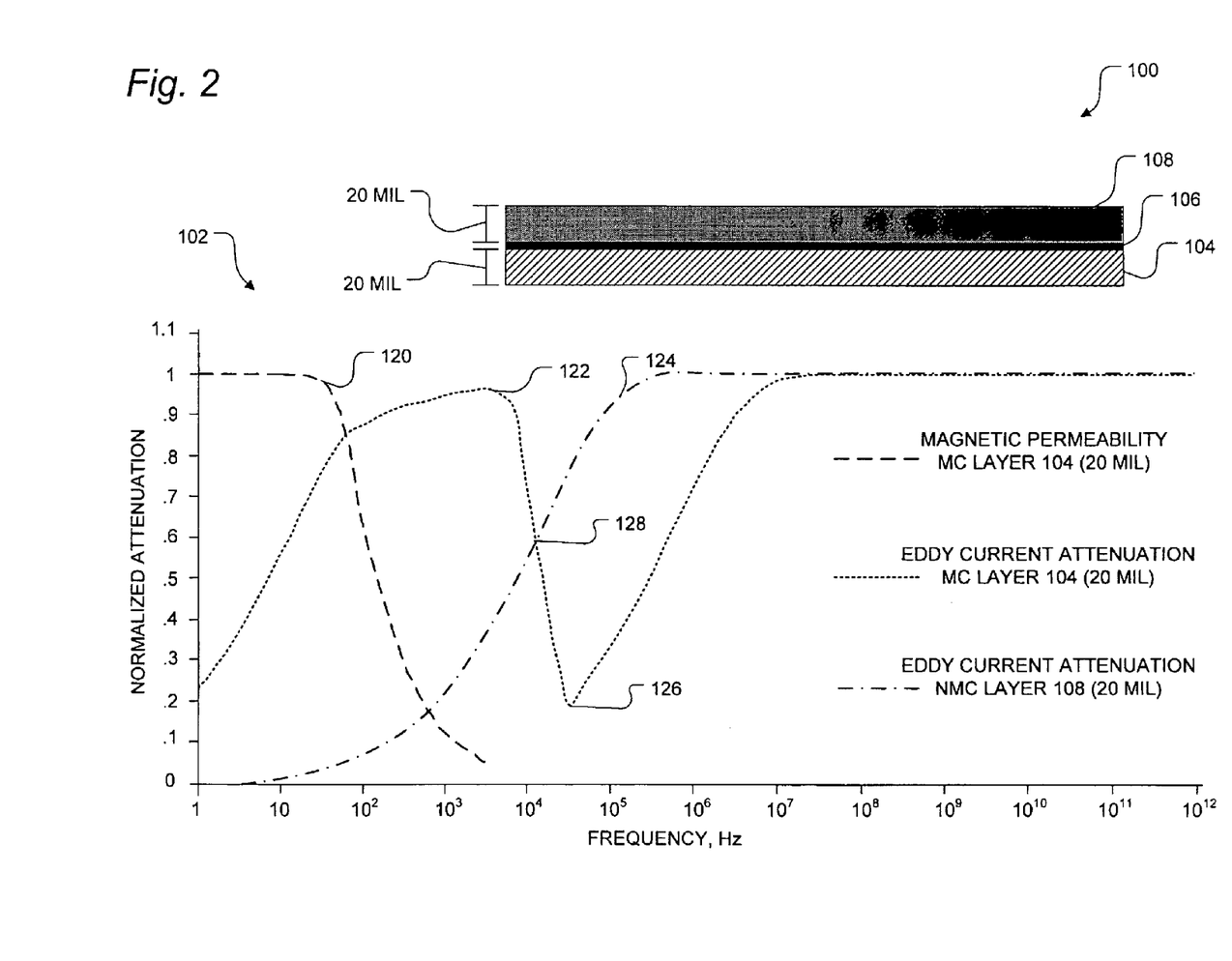
FIG. 2 is a schematic diagram of a magnetic shield and a corresponding plot of magnetic field attenuation over a frequency range, according to an example.

FIG. 2 shows a magnetic shield 100 and a graph 102 that demonstrates an attenuation simulation of the shield 100. The shield 100 includes an MC layer 104, an NC layer 106, and an NMC layer 108, both of which are about 20 mils in thickness. The NC layer 106 is interposed between the MC layer 104 and the NMC layer 108. Separating the MC layer 104 from the NMC layer 108 is the NC layer 106, which may include a variety of non-conductive materials (e.g., an epoxy, a dielectric layer, or a ferrite material The graph 102 plots a normalized attenuation of three responses 120, 122, and 124 of the shield 100 to an applied magnetic field over a frequency range of 1 Hz to $10^{12}$ Hz. The response 120 is attributed to the magnetic permeability ($\mu$) of the MC layer 104. As the frequency of the applied magnetic field surpasses 100 Hz, the magnetic permeability of the MC layer 104 decreases. Eventually, the magnetic permeability of the MC layer 104 will be zero and attenuation attribute to magnetic permeability will likewise be zero.

Although the magnetic permeability of the MC layer 104 decreases with increasing frequency, the shield 100 continues to attenuate the applied magnetic field. Attenuation from about 100 Hz to $10^4$ Hz occurs as a combination of the magnetic permeability of the MC layer 104 and a phenomenon referred to as eddy current attenuation. The response 122 demonstrates a combination of both of these types of attenuation.

In general, eddy current attenuation occurs in conductive materials and is produced by an alternating or moving magnetic field intersecting a conductor or vice-versa. The relative motion causes a circulating flow of electrons, or current, within a conductor. These circulating eddies of current create electromagnets with magnetic fields that oppose the change in the external magnetic field. The stronger the magnetic field, or greater the electrical conductivity of the conductor, the greater the currents developed and the greater the opposing force.

Because eddy current attenuation is a function of conductivity, the material choice of a conductor is a factor in the attenuation of the applied magnetic field. Moreover, the current density of the eddy currents also plays a significant role in the attenuation of the applied magnetic field. The density of the eddy current is a function of a variety of factors, including the frequency of the applied magnetic field. The higher the frequency is, the denser the eddy current at the surface of a conductor. Thus, in the graph 102, as the applied magnetic field moves toward higher frequencies, the eddy current density will be more densely distributed at the surface of the MC layer 104 (and the NMC layer 108).

A formula that is used to quantify the density of an eddy current is given as:

$$\delta = \sqrt{\frac{2\rho}{\omega\mu}}$$

Where $\delta$ is referred to as the skin depth, $\mu$ is magnetic permeability and $\rho$ is the resistivity of a conductor, and $\omega$ is the angular frequency of the applied magnetic field. The above formula shows the relationship between frequency and skin depth: as the frequency of the magnetic field increases, the skin depth decreases. A formula that relates the skin depth to current density is given as:

$$J = J_s e^{-\frac{d}{\delta}}$$

Where J is the current density, $J_s$ is a constant, d is the depth into a conductor, and $\delta$ is the skin depth.

Generally speaking, separating conductive layers, such as the layers 104, 108 with an insulator, increases the effectiveness of eddy current attenuation. This is primarily due to the fact that eddy currents are closely distributed to the surface of a conductor. As the formula above shows, current density exponentially decreases with depth into a conductor. By advantageously separating the conductive layers, two surfaces are created, producing two exponential eddy current distributions within a shield. As a result, a larger amount of eddy currents are contained within a single shield (relative to a shield that has only a single conductive layer). Moreover, more conductive layers may be added, increasing the effectiveness of eddy current attenuation (see FIGS. 7-8).

As the graph 102 shows, eddy current attenuation becomes more dominant with increasing frequency. As eddy currents move closer to the surface of the layers 104, 108, the eddy currents within the conductors become larger, producing larger magnetic fields that counteract the applied magnetic field.

Although the response 122 shows attenuation above 0.8 for a frequency range of about 100 Hz to $10^4$ Hz, the combined attenuation effect (i.e., magnetic permeability combined with eddy current attenuation) reaches an attenuation minimum 126 (about 0.2) at about $5 \times 10^4$ Hz. At the minimum 126, the magnetic permeability of the MC layer 104 is about zero and the eddy current density within the MC layer 104 is not sufficient enough to create significant eddy current attention of the applied magnetic field.

To compensate for the loss of attenuation, the shield 100 includes the NMC layer 108. Because the NMC layer 108 is less resistive (i.e., a low $\rho$ value), the NMC layer 108 will have denser, and therefore, larger eddy currents than the MC layer 104. Thus, the NMC layer 108 provides a measure of eddy current attenuation that compensates for the minimum 126 produced by the response 122. Consequently the attenuation minimum of the shield 100 moves from the minimum 126 to a higher attenuation minimum 128. The minimum 128 has an attenuation of about 0.6, which is higher than the attenuation of the minimum 126.

By including both the layers 104, 108 in the shield 100, a broad frequency range of magnetic fields may be effectively blocked by the shield 100. On one hand, the MC layer 104 shields DC magnetic fields and low frequency AC fields. On the other hand, the NMC layer 108 attenuates higher frequency AC magnetic fields. As will be described below, the MC layer 104 and the NMC layer 108 may be tailored to a variety of thicknesses in order to adjust, or expand the attenuation range of each of the curves 120-124. Moreover, the order of the layers 104, 108 should not be viewed as limiting. For example, the MC layer 104 may be positioned above the NMC layer 108. In addition, more layers may be added to a shield, achieving a desired attenuation.

c) Example 2

Figure 3:
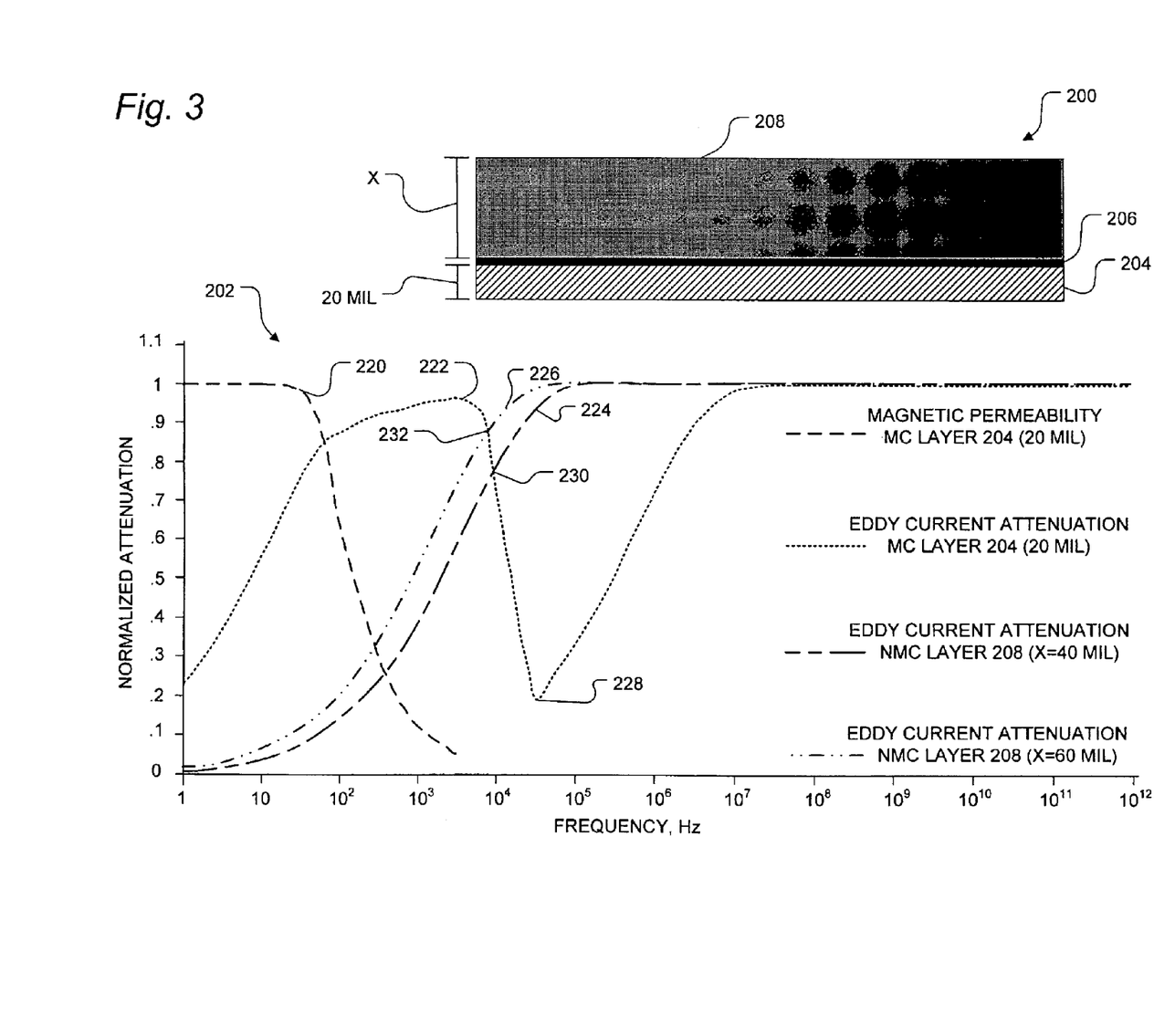
FIG. 3 is another schematic diagram of a magnetic shield and a corresponding plot of magnetic field attenuation over a frequency range, according to an example.

FIG. 3 shows a magnetic shield 200 and a graph 202 that demonstrates an attenuation simulation of the shield 200. The shield 200 includes an MC layer 204, an NC layer 206, and an NMC layer 208. The NC layer 206 is interposed between the MC layer 204 and the NMC layer 208.

The graph 202 plots a normalized attenuation of four responses 220, 222, and 224, and 226 of the shield 200 to an applied magnetic field over a frequency range of 1 Hz to $10^{12}$ Hz. The response 220 is attenuation due to the magnetic permeability of the MC layer 204, which has a thickness of about 20 mils. As the magnetic permeability of the MC layer 204 decreases with increasing frequency, the eddy current attenuation of the MC layer 204 approaches a minimum 228.

To shift and increase the attenuation minimum 228, the shield 200 includes the NMC layer 208. In the graph 202, responses 224, 226 reflect two different thicknesses of the NMC layer 208 and the resulting eddy current attenuation of each thickness. Generally speaking, the thicker the NMC layer 208, the higher the eddy current attenuation. For example, if the thickness (X) of the NMC layer 208 is about 40 mils, the response 224 will produce a minimum 230 of eddy current attenuation, which is about 0.8. As another example, if the thickness (X) of the NMC layer 208 is about 60 mils, the response 226 will produce a minimum 232 of eddy current attenuation, which is about 0.9. A variety of other thicknesses of both the MC layer 204 and the NMC layer 208 are possible.

d) Example 3

Figure 4:
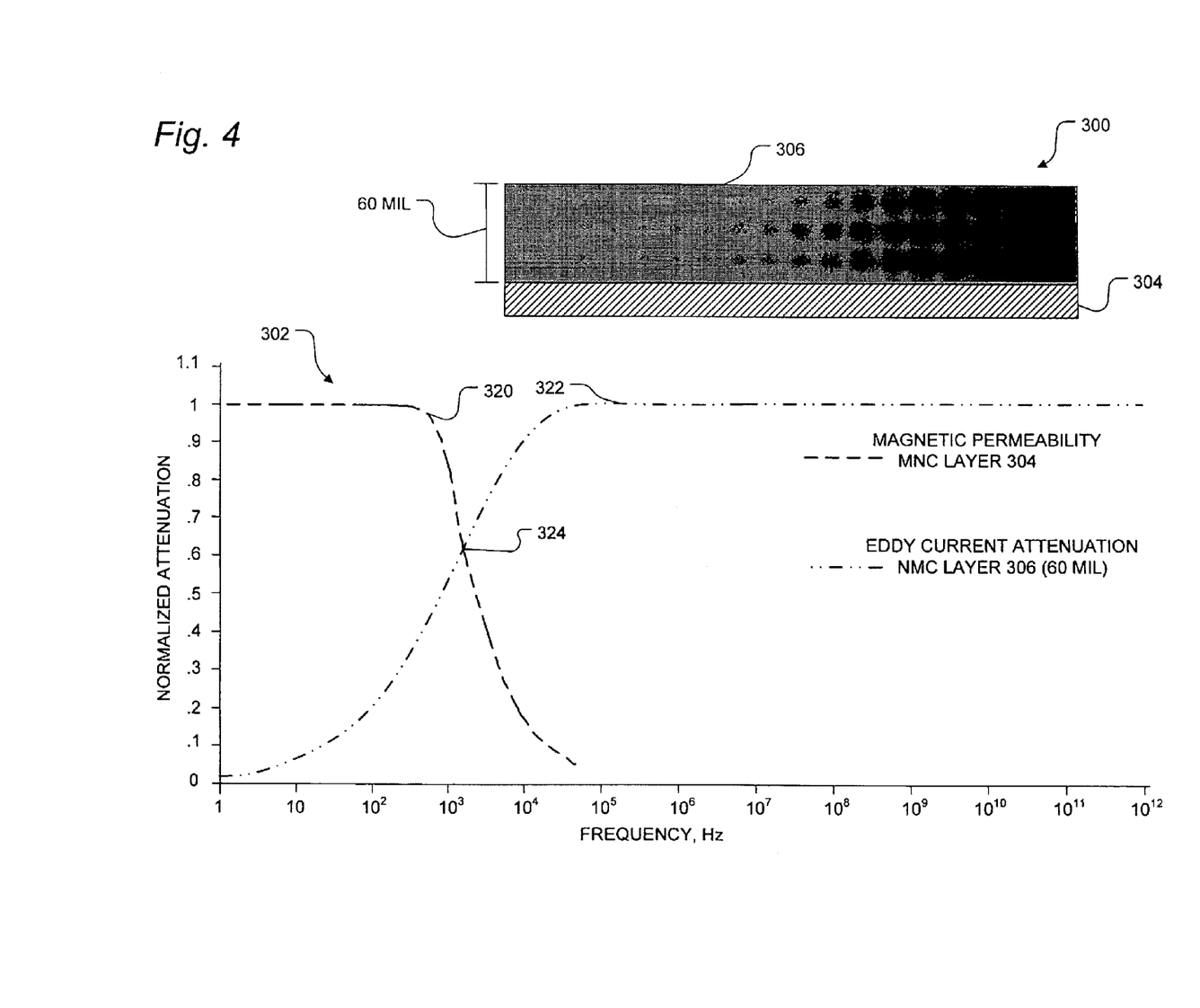
FIG. 4 is another schematic diagram of a magnetic shield and a corresponding plot of magnetic field attenuation over a frequency range, according to an example.

FIG. 4 shows a magnetic shield 300 and a graph 302 that demonstrates an attenuation simulation of the shield 300. The shield 300 includes an MNC layer 304 (e.g. a ferrite) and an NMC layer 306. Unlike the examples of FIGS. 2, 3, the MNC layer 304 is non-conductive; therefore, the MNC layer 304 does not produce a combined attenuation effect (i.e., magnetic permeability and eddy current attenuation).

The graph 302 plots a normalized attenuation of two responses 320 and 322 of the shield 300 to an applied magnetic field over a frequency range of 1 Hz to $10^{12}$ Hz. The response 320 is attributed to the magnetic permeability ($\mu$) of the MC layer 204. At a frequency of about $10^3$ Hz, the attenuation of the response 320 begins to decrease. To compensate for the decrease in attenuation of the response 320, the shield 300 includes the NMC layer 306, which in this example is about 60 mils.

The response 322 shows attenuation of the NMC layer 306. As the frequency of the applied magnetic field increases, eddy current attenuation becomes more effective. The graph 302 shows an attenuation minimum 324, which is about 0.6. The thickness of the layers 304, 306 may be increased or decreased, likewise increasing or decreasing the minimum 324.

e) Example 4

Figure 5:
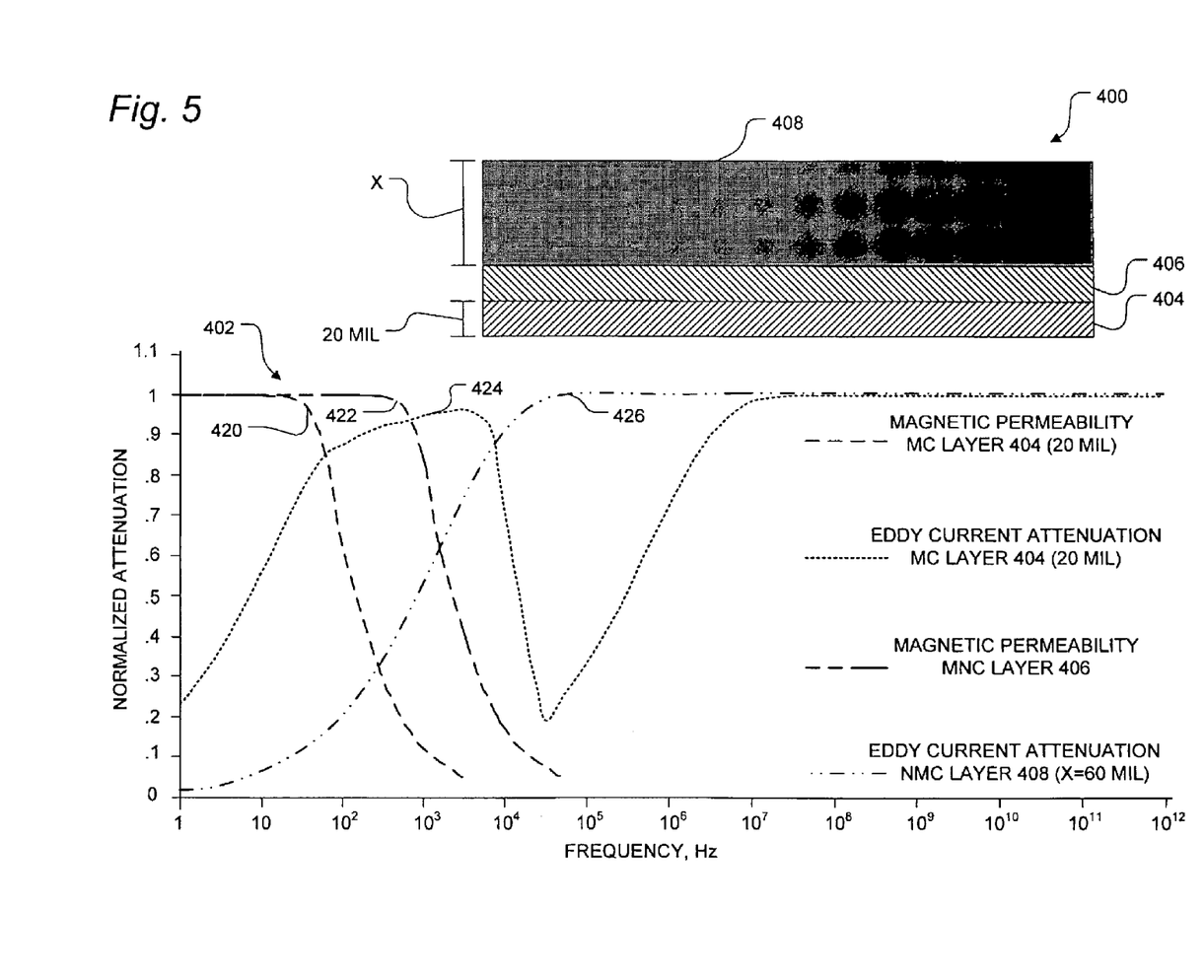
FIG. 5 is another schematic diagram of a magnetic shield and a corresponding plot of magnetic field attenuation over a frequency range, according to an example.

FIG. 5 shows a magnetic shield 400 and a graph 402 that demonstrates an attenuation simulation of the shield 400. The shield 400 includes an MC layer 404, an MNC layer 406, and an NMC layer 408. The MNC layer 406 is interposed between the MC layer 404 and the NMC layer 408.

The graph 402 plots a normalized attenuation of four responses 420, 422, 424, and 426 of the shield 400 to an applied magnetic field over a frequency range of 1 Hz to $10^{12}$ Hz. The shield 400 and the graph 402 are similar to the shield 200 and the graph 202 of FIG. 3. However, the NC layer 206 has been replaced with the MNC layer 406. By using a ferrite material (in lieu of non-magnetic non-conductive material), the attenuation of the shield 400 may be more effective than the shield 200 at low frequency ranges.

Example 5

Figure 6:
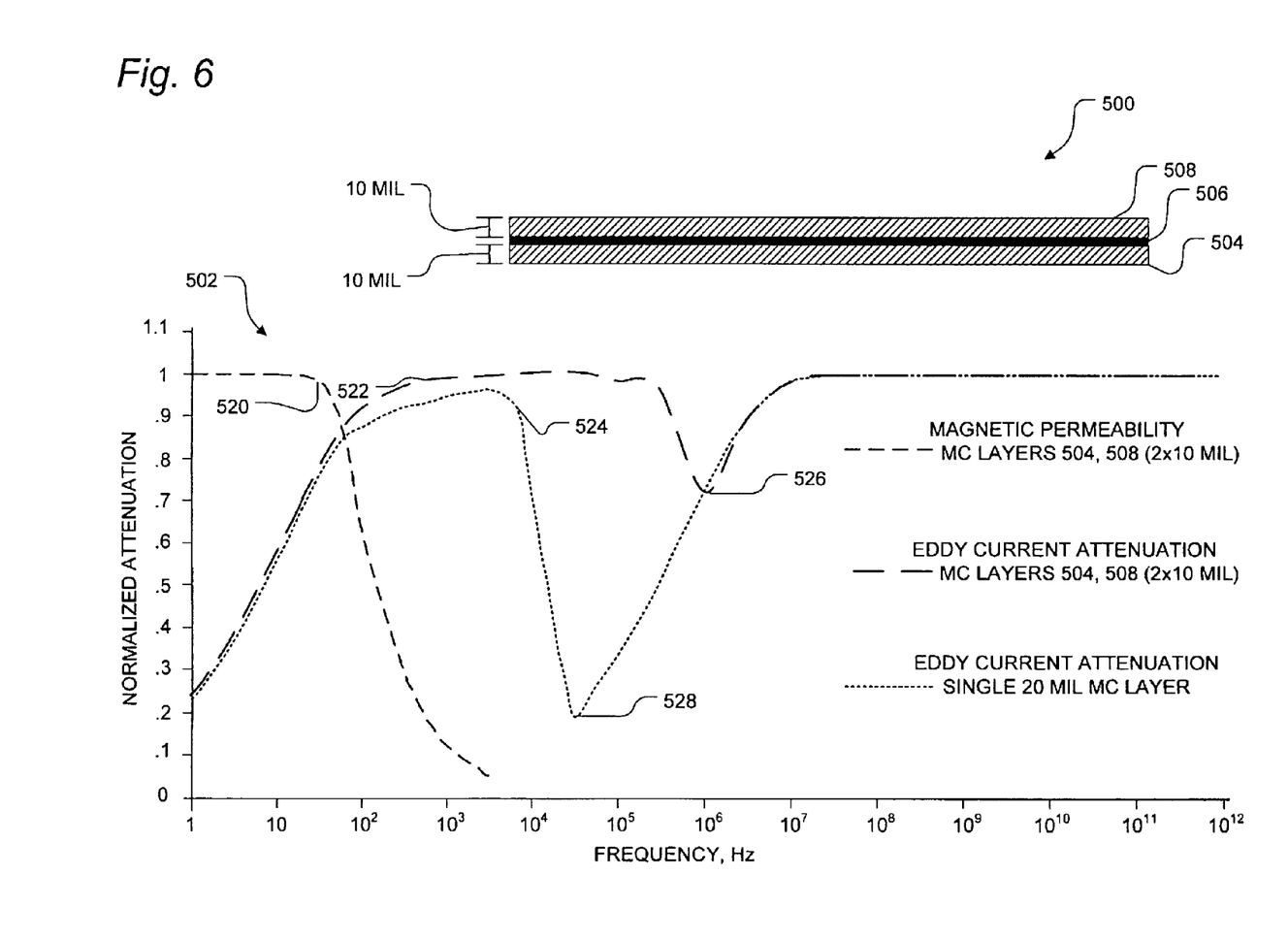
FIG. 6 is another schematic diagram of a magnetic shield and a corresponding plot of magnetic field attenuation over a frequency range, according to an example.

FIG. 6 shows a magnetic shield 500 and a graph 502 that demonstrates an attenuation simulation of the shield 500. The shield 500 includes an MC layer 504, an NC layer 506, and an MC layer 508. The MNC layer 506 is interposed between the MC layer 504 and the MC layer 508. The MC layer 504 may comprise a high magnetic permeability material; the MNC layer 506 may comprise a ferrite material; and the MC layer 508 may comprise a conductive material, for example. The MC layers 504, 508 are each about 10 mils thick.

The graph 502 plots a normalized attenuation of three responses 520, 522, and 524 of the shield 500 to an applied magnetic field over a frequency range of 1 Hz to $10^{12}$ Hz. The response 520 shows attenuation that is attributed to the magnetic permeability of the MC layers 504, 508. The response 522 shows eddy current attenuation of the shield 500, which is provided by the MC layers 504, 508. The response 522 includes an attenuation minimum 526 (about 0.75). The response 524, on the other hand, shows eddy current attenuation that is attributed to a single MC layer that is about 20 mils thick, such as the MC layer 104 (see FIG. 2), having an attenuation minimum 528 (about 0.2).

The graph 502 demonstrates that separate MC layers provide better eddy current attenuation than a single but thicker MC layer. Specifically, two 10 mils thick MC layers 504, 508 provide better attenuation than a single, thicker 20 mils MC layer. It is important to note that if the MC layers are not separated by an insulator, the individual MC layers would form a single MC layer, creating only one effective surface and therefore reducing the amount of eddy currents that may be contained within a shield.

g) Example 6

Figure 7:
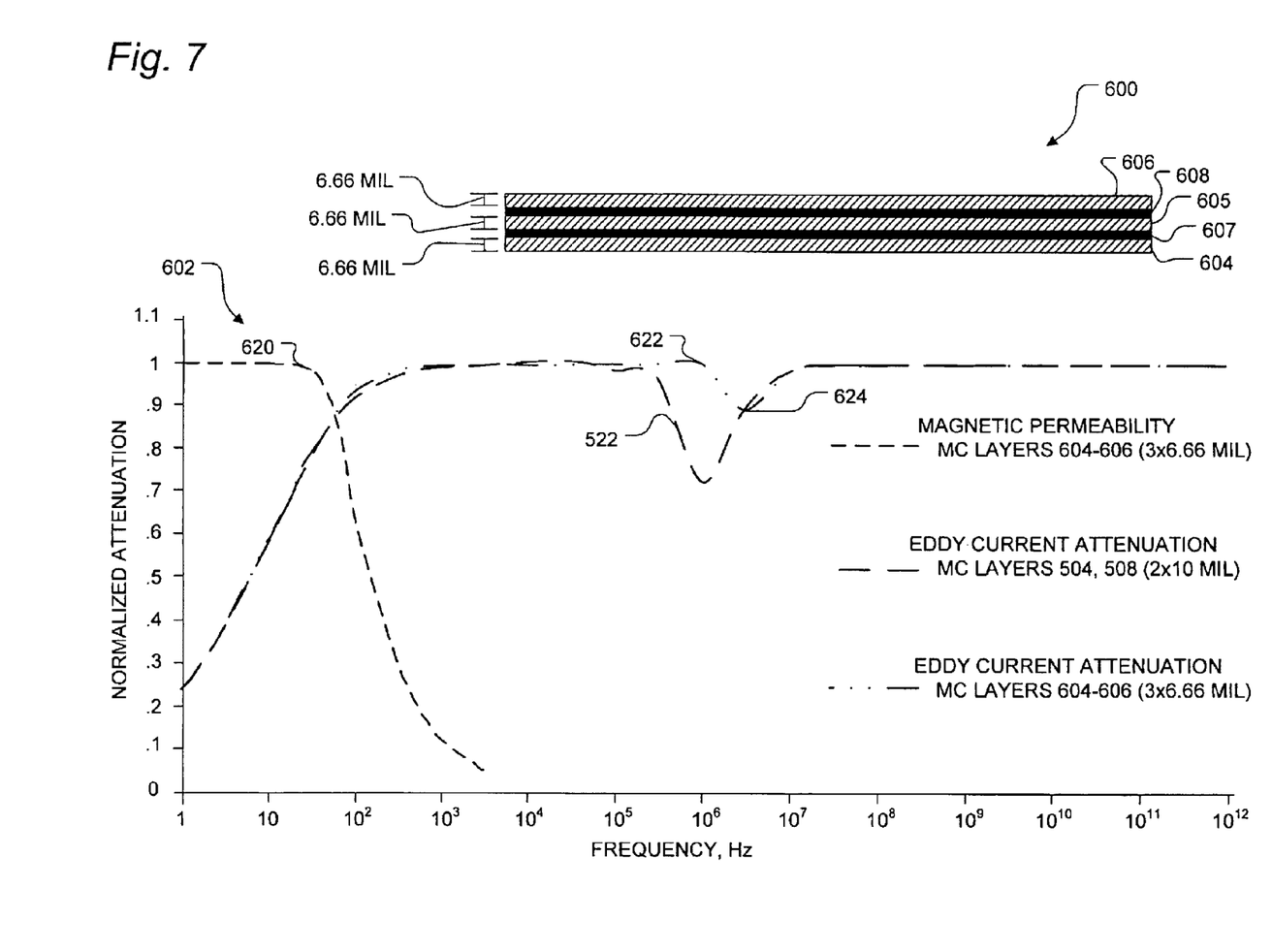
FIG. 7 is another schematic diagram of a magnetic shield and a corresponding plot of magnetic field attenuation over a frequency range, according to an example.

FIG. 7 shows a magnetic shield 600 having separated MC layers and a graph 602 that demonstrates an attenuation simulation of the shield 600. The shield 600 includes MC layers 604-606 and NC layers 607, 608. The MNC layers 604-606 are interposed between the NC layers 607, 608.

The graph 602 plots a normalized attenuation of two responses 620 and 622 to an applied magnetic field over a frequency range of 1 Hz to $10^{12}$ Hz. The graph 602 also shows the response 522 of FIG. 6 (i.e., eddy current attenuation of the MC layers 504, 508 of the shield 500). The response 620 shows attenuation that is attributed to the magnetic permeability of the MC layers 604-606. The response 622 shows eddy current attenuation of the shield 600, which is provided by the MC layers 604-606. The response 622 includes an attenuation minimum 624 (about 0.9). The graph 602 shows that increasing the number of conductive layers in a shield further increases the effectiveness of eddy current attenuation. It should be noted that the aggregated thickness of the MC layers 604-606 is about 20 mils, with is the same thickness as the MC layer 104 (FIG. 2) and the aggregated thickness of the MC layers 504, 508 (FIG. 5).

h) Example 7

Figure 8:
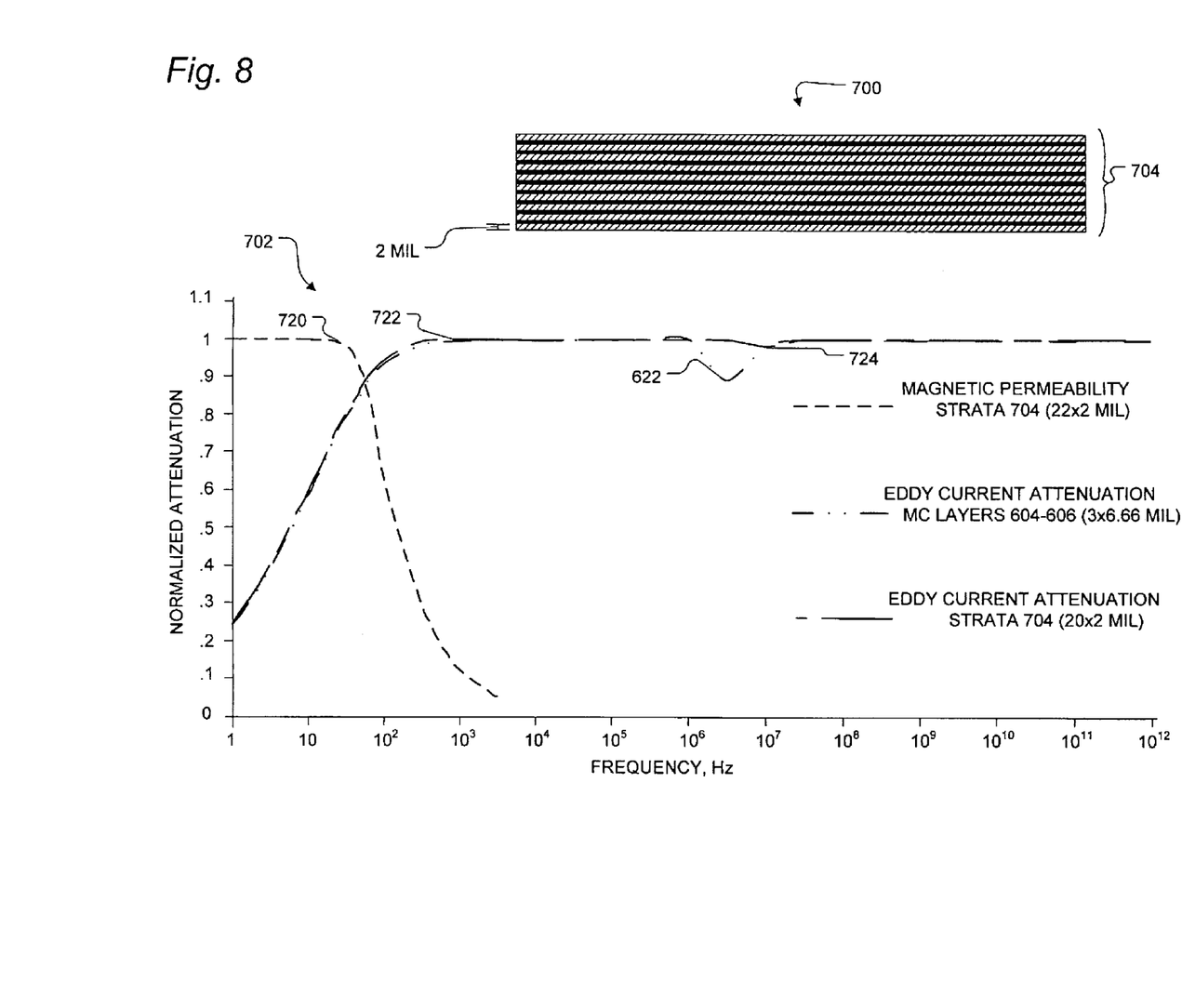
FIG. 8 is another schematic diagram of a magnetic shield and a corresponding plot of magnetic field attenuation over a frequency range, according to an example.

FIG. 8 shows a magnetic shield 700 having separated MC layers and a graph 702 that demonstrates an attenuation simulation of the shield 600. The shield 700 includes a strata 704 of MC layers that are each separated by an NC layer.

The graph 702 plots a normalized attenuation of two responses 720 and 722 to an applied magnetic field over a frequency range of 1 Hz to $10^{12}$ Hz. The graph 702 also shows the response 622 of FIG. 6 (i.e., eddy current attenuation of the MC layers 604-606 of the shield 600). The response 720 shows attenuation that is attributed to the magnetic permeability of the MC layers within the strata 704. The response 722 shows eddy current attenuation of the shield 700, which is provided by the MC layers within the strata 704. The response 622 includes an attenuation minimum 724 (about 0.98). The aggregated thickness of the MC layers within the strata 704 is about 20 mils.

h) Example 8

Figure 9:
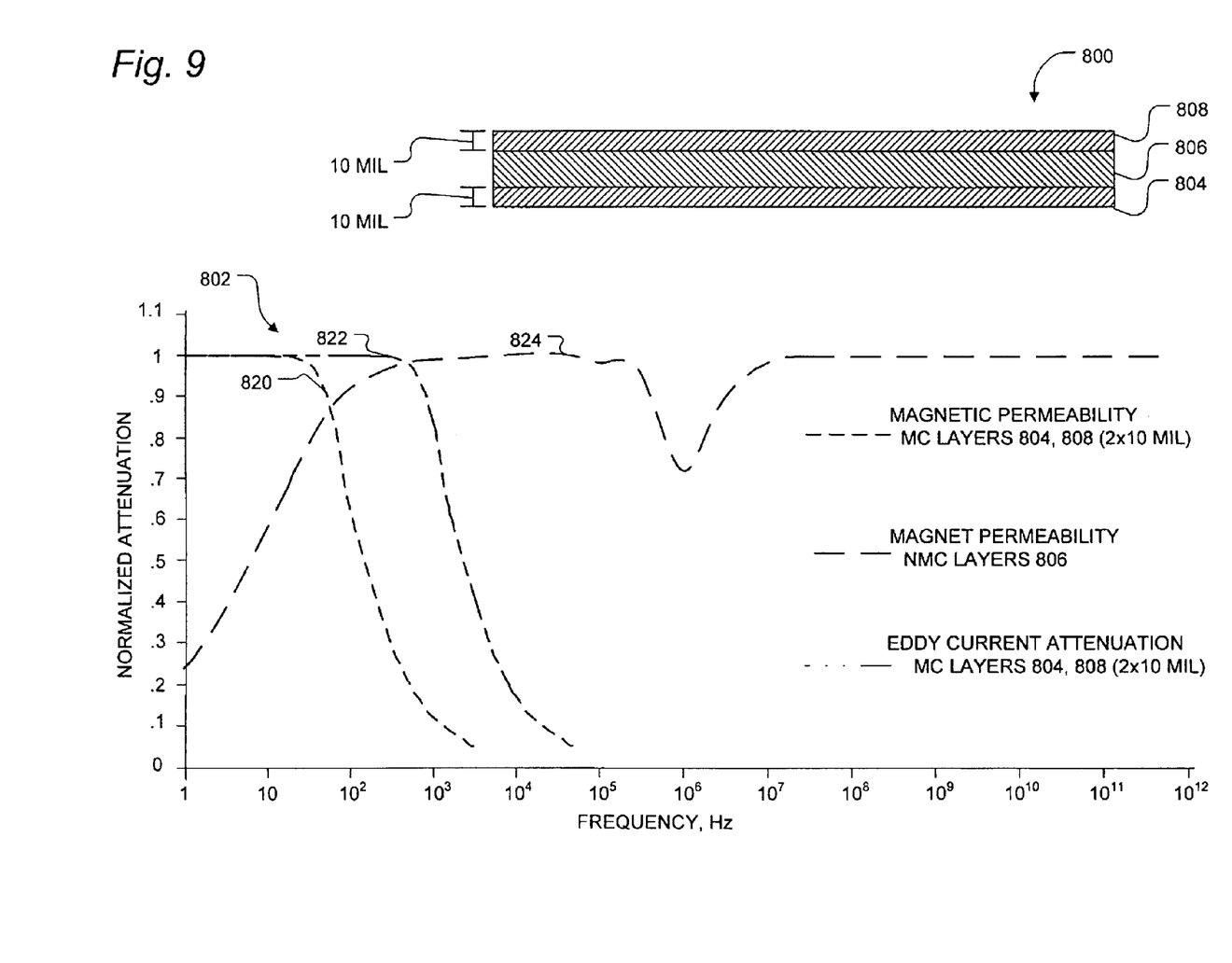
FIG. 9 is another schematic diagram of a magnetic shield and a corresponding plot of magnetic field attenuation over a frequency range, according to an example.

FIG. 9 shows a magnetic shield 800 and a graph 802 that demonstrates an attenuation simulation of the shield 800. The shield 800 includes an MC layer 804, an MNC layer 806 (e.g. a ferrite), and an NMC layer 808. The MNC layer 806 is interposed between the MC layer 804 and the MC layer 808.

The graph 802 plots a normalized attenuation of three responses 820, 822, and 824 of the shield 800 to an applied magnetic field over a frequency range of 1 Hz to $10^{12}$ Hz. The response 820 shows attenuation that is attributed to the magnetic permeability of the MC layers 804, 808. The shield 800 and the graph 802 are similar to the shields 200, 500; however, the NC layer has been replaced with the MNC layer 806. As described above, the MNC layer 806 may increase attenuation at low frequency ranges. The response 822 shows the attenuation of the MNC layer 806.

To increase attenuation at high frequency ranges, multiple MC layers are included in the shield 800. The response 824 shows eddy current attenuation of the shield 800, which is provided by the MC layers 804, 808.

i) Conclusion

A variety of examples have been described above. More generally, those skilled in the art will understand that changes and modifications may be made to these examples without departing from the true scope and spirit of the present invention, which is defined by the claims. Thus, for example, a magnetic shield should not be limited to the thickness of the layers nor order of the layers that the shield comprises. Moreover, a variety of arrangements of the describe layers are possible. Although not illustrated, a magnetic shield may include multiple NMC layers in order to increase eddy current density within the shield. In addition, a variety of method may be employed in order to fabricate a magnetic shield. For example, MC, NMC, and NC layers may be laminate films that are bonded together with an epoxy. Alternatively, such layers may be deposited or grown on a substrate.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:
1. A system comprising:
a microelectronic device;
a first magnetic shield mounted to a first side of at least one of the microelectronic device or a package within which the microelectronic device is positioned, wherein the first magnetic shield is substantially planar, and wherein the first magnetic shield comprises:
a first layer comprising a first magnetic conductive material,
a second layer comprising a second magnetic conductive material, and
a third layer comprising a first non-conductive material, wherein the third layer is interposed between the first layer and the second layer and wherein each of the first and second layers is directly adjacent to the third layer,
wherein the first layer is defined by a first thickness that is greater than about 10 mils and the second layer is defined by a second thickness that is greater than about 10 mils; and
a second magnetic shield separated from the first magnetic shield by the microelectronic device, wherein the second magnetic shield comprises:
a fourth layer comprising at least one of a third magnetic conductive material or a first non-magnetic conductive material, a fifth layer comprising at least one of a fourth magnetic conductive material or a second non-magnetic conductive material, and a sixth layer comprising a second non-conductive material, wherein the sixth layer is interposed between the fourth layer and the fifth layer.

2. The system of claim 1, wherein each of the first magnetic conductive material and the second magnetic conductive material and the second magnetic conductive material comprises a high permeability material selected from the group consisting of NiFe and NiMoFe.

3. The system of claim 1, wherein the non-conductive material comprises at least one of an epoxy, a ferrite material, or a dielectric material.

4. A shielded microelectronic device comprising:
a microelectronic device;
a first magnetic shield positioned above the microelectronic device, wherein the first magnetic shield comprises a first layer for attenuating a direct current magnetic field, a second layer for attenuating the direct current magnetic field, and a third layer interposed between the first layer and the second layer; and
a second magnetic shield positioned below the microelectronic device, wherein the second magnetic shield comprises a fourth layer for attenuating the direct current magnetic field, a fifth layer for attenuating the direct current magnetic field, and a sixth layer interposed between the fourth layer and the fifth layer,
wherein each of the first, second, fourth, and fifth layers comprises a conductive material and wherein each of the third and sixth layers comprises a non-conductive material.

5. The shielded microelectronic device as in claim 4, wherein the first layer is defined by a thickness that is greater than about 10 mils and the fourth layer is defined by a thickness that is greater than about 10 mils.

6. The shielded microelectronic device as in claim 4, wherein each of the first and fourth layers comprises a magnetic conductive material.

7. A system comprising:
a microelectronic device;
a first magnetic shield positioned above the microelectronic device, wherein the first magnetic shield comprises a first layer comprising a first conductive material and configured to attenuate direct current magnetic fields, a second layer comprising a second conductive material and configured to attenuate direct current magnetic fields, and a third layer comprising a non-conductive material and interposed between the first and second layers; and
a second magnetic shield positioned below the microelectronic device, wherein the second magnetic shield comprises a fourth layer configured to attenuate direct current magnetic fields and a fifth layer configured to attenuate direct current magnetic fields.

8. The system of claim 7, wherein each of the first magnetic conductive material and the second magnetic conductive material comprises a high permeability material selected from the group consisting of NiFe and NiMoFe.

9. The system of claim 1, wherein the first magnetic shield is mounted to the first side via at least one of a conductive epoxy or a non-conductive epoxy.

10. The system of claim 1, wherein each of the first layer, the second layer, and the third layer is a laminate film.

11. The system of claim 4, wherein the first magnetic shield is physically separated from the second magnetic shield by the microelectronic device.

12. The system of claim 4, wherein the first and second magnetic shields are mounted to at least one of the microelectronic device or a package within which the microelectronic device is positioned.

13. The system of claim 6, wherein the magnetic conductive material comprises a high permeability material selected from the group consisting of NiFe and NiMoFe.

14. The system of claim 4, wherein each of the first, second, third, fourth, fifth, and sixth layers is a laminate film.

15. The system of claim 7, wherein the first magnetic shield is physically separated from the second magnetic shield by the microelectronic device.

16. The system of claim 7, wherein the first and second magnetic shields are mounted to at least one of the microelectronic device or a package within which the microelectronic device is positioned.

17. The system of claim 7, wherein each of the first, second, third, fourth, and fifth layers is a laminate film.

* * * * *

UNITED STATES PATENT AND TRADEMARK OFFICE
CERTIFICATE OF CORRECTION

PATENT NO. : 8,399,964 B2
APPLICATION NO. : 12/861442
DATED : March 19, 2013
INVENTOR(S) : Romney R. Katti It is certified that error appears in the above-identified patent and that said Letters Patent is hereby corrected as shown below:

In the Claims:

Col. 9, Claim 2, Line 9: remove "and the second magnetic conductive material"

Signed and Sealed this
Thirtieth Day of July, 2013

Teresa Stanek Rea
*Acting Director of the United States Patent and Trademark Office*